(12) United States Patent
Zou et al.

(10) Patent No.: US 10,371,980 B2
(45) Date of Patent: Aug. 6, 2019

(54) DISPLAY SUBSTRATE, DISPLAY PANEL AND DISPLAY DEVICE

(71) Applicant: Xiamen Tianma Micro-Electronics Co., Ltd., Xiamen (CN)

(72) Inventors: Zongjun Zou, Xiamen (CN); Ying Sun, Xiamen (CN); Yumin Xu, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 15/791,990

(22) Filed: Oct. 24, 2017

(65) Prior Publication Data

US 2018/0373080 A1  Dec. 27, 2018

(30) Foreign Application Priority Data

Jun. 23, 2017 (CN) .......................... 2017 1 0485768

(51) Int. Cl.
*G02F 1/1333*  (2006.01)
*G02F 1/1362*  (2006.01)
(Continued)

(52) U.S. Cl.
CPC ........ *G02F 1/13338* (2013.01); *G02F 1/1368* (2013.01); *G02F 1/136227* (2013.01); (Continued)

(58) Field of Classification Search
CPC .......... G02F 1/13338; G02F 1/136227; G02F 1/136286; G02F 1/1368; G02F 1/133514; (Continued)

(56) References Cited

U.S. PATENT DOCUMENTS 9,024,913 B1 * 5/2015 Jung ..................... G06F 3/044
345/174
2012/0218199 A1 * 8/2012 Kim ..................... G06F 3/0412
345/173
(Continued)

FOREIGN PATENT DOCUMENTS

CN          106383608 A      2/2017

*Primary Examiner* — Md Saiful A Siddiqui
(74) *Attorney, Agent, or Firm* — Tarolli, Sundheim, Covell & Tummino LLP (57) ABSTRACT

A display substrate, a display panel and a display device, relating to the field of display techniques, wherein a common electrode layer is placed in a display area and includes a plurality of common electrode blocks arranged in an array, n lead wires are provided corresponding to each column of the common electrode blocks, each lead wire includes a first portion, a second portion and a third portion, a first end of the first portion is electrically connected with the integrated circuit, a second end of the first portion is electrically connected with a first end of the second portion, a second end of the second portion is electrically connected with a first end of the third portion, a second portion of an $i^{th}$ lead wire passes a geometric center of an $i^{th}$ common electrode block and is electrically connected with the $i^{th}$ common electrode block thereof.

17 Claims, 11 Drawing Sheets

(51) Int. Cl.
   *G02F 1/1368* (2006.01)
   *G06F 3/041* (2006.01)
   *H01L 27/12* (2006.01)
   *G06F 3/044* (2006.01)
   *G02F 1/1335* (2006.01)

(52) U.S. Cl.
   CPC ........ *G02F 1/136286* (2013.01); *G06F 3/044* (2013.01); *G06F 3/0412* (2013.01); *H01L 27/124* (2013.01); *G02F 1/133514* (2013.01); *G02F 2201/121* (2013.01); *G02F 2201/123* (2013.01)

(58) Field of Classification Search
   CPC ......... G02F 2201/121; G02F 2201/123; G06F 3/0412
   See application file for complete search history.

(56) References Cited

U.S. PATENT DOCUMENTS

| | | | |
|---|---|---|---|
| 2013/0278557 A1* | 10/2013 | Hotelling | G06F 3/0412 345/174 |
| 2014/0362031 A1* | 12/2014 | Mo | G09G 3/36 345/174 |

* cited by examiner

DISPLAY SUBSTRATE, DISPLAY PANEL AND DISPLAY DEVICE

CROSS-REFERENCE TO RELATED APPLICATIONS

The present application claims priority to Chinese Patent Application No. 201710485768.6, filed on Jun. 23, 2017, the content of which is incorporated herein by reference in its entirety.

TECHNICAL FIELD

The present disclosure relates to the field of display techniques and, particularly, relates to a display substrate, a display panel and a display device.

BACKGROUND

With a rapid development of display technologies, users have higher requirements on performance of display devices, and then a display device having a touch function emerges. At present, a touch electrode is usually embedded into a display panel of the display device (i.e., Touch Embed Display, TED), so that the display device can possess a touch function.

The display panel of the display device having the touch function includes an array substrate, the array substrate is provided with a plurality of common electrode blocks arranged in an array and a plurality of lead wires, the plurality of lead wires are located at another layer insulated from the plurality of common electrode blocks, in the related art, as for a column of common electrode blocks, the through-holes, via which the common electrode blocks are connected with the lead wires, are arranged correspondingly from left to right with respect to the common electrode blocks from up to down, so that a distance between each through-hole corresponding to each common electrode block and a boundary of the same common electrode block varies, and thus common electrode signal applied on each common electrode block is not uniform at each boundary, resulting in an obvious display difference, and thus resulting in a poor display effect.

SUMMARY

In view of the above, embodiments of the present disclosure provide a display substrate, a display panel and a display device, which can solve the problem of a poor display effect caused by a non-uniform common electrode signal on the common electrode blocks.

In a first aspect, the present disclosure provides a display substrate, including a display area; and a peripheral area surrounding the display area; wherein a common electrode layer is placed in the display area, the common electrode layer comprises a plurality of common electrode blocks arranged in an array, each common electrode block is also used as a touch electrode during a touch stage; wherein an integrated circuit is arranged in a portion of the peripheral area corresponding to a column direction of the common electrode blocks, the integrated circuit is electrically connected with the plurality of common electrode blocks by a plurality of lead wires; wherein n lead wires are provided corresponding to each column of the common electrode blocks, and a total number of the common electrode blocks in each column is n; each lead wire comprises a first portion, a second portion and a third portion, an extending direction of the first portion and the third portion is the column direction of the common electrode blocks, an extending direction of the second portion is a row direction of the common electrode blocks, a first end of the first portion is electrically connected with the integrated circuit, a second end of the first portion is electrically connected with a first end of the second portion, and a second end of the second portion is electrically connected with a first end of the third portion; and for each column of the common electrode blocks, the second portion of an $i^{th}$ lead wire passes a geometric center of an $i^{th}$ common electrode block and is electrically connected with the $i^{th}$ common electrode block at the geometric center of the $i^{th}$ common electrode block, i is a positive integer, and $1 \leq i \leq n$.

In a second aspect, the present disclosure provides a display panel, including the display substrate as described above.

In a third aspect, the present disclosure provides a display device, including the display panel as described above.

The present disclosure provides a display substrate, a display panel and a display device, wherein the plurality of common electrode blocks arranged in the display area of the display substrate is also used as the touch electrode during the touch stage, n lead wires are provided corresponding to each column of common electrode blocks, each lead wire includes the first portion, the second portion and the third portion, the extending direction of the first portion and the third portion is the column direction of the common electrode blocks, and the extending direction of the second portion is the row direction of the common electrode blocks, the first end of the first portion is electrically connected with the integrated circuit, the second end of the first portion is electrically connected with the first end of the second portion, the second end of the second portion is electrically connected with the first end of the third portion, since the second portion of the $i^{th}$ lead wire passes through the geometric center of the $i^{th}$ common electrode block and is electrically connected with the $i^{th}$ common electrode block at the geometric center of the $i^{th}$ common electrode block, n is the total number of the common electrode blocks in each column, i is a positive integer greater than or equal to 1 and less than or equal to n, so that the common electrode signal applied on each common electrode block is uniformly distributed at each boundary of the common electrode block, the common electrode signal at adjacent boundaries of two adjacent common electrode blocks can be similar or the same, the display difference is obviously reduced or even eliminated, thereby effectively improving the display effect of the display device.

BRIEF DESCRIPTION OF DRAWINGS

In order to more clearly illustrate technical solutions in embodiments of the present disclosure, the accompanying drawings necessary for the embodiments are briefly introduced as follows. Obviously, the drawings described as follows are merely part of the embodiments of the present disclosure, other drawings can also be acquired by those skilled in the art without paying creative efforts.

DESCRIPTION OF EMBODIMENTS

The present disclosure will be further illustrated with reference to the accompanying drawings and embodiments.

It should be understood that, the described embodiments are merely exemplary embodiments of the present disclosure, which shall not limit the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise clearly noted in the context, the "a", "an", "the" and "such" used in a singular form in the embodiments and claims of the present disclosure are also intended to represent a plural form.

It should be understood that, the expression "and/or" used herein merely refers to an association relation that describes the associated objects, indicating that there may be three relations, for example, A and/or B may indicate that: A exists individually, A and B exist at the same time, and B exists individually. In addition, the character "/" used herein usually indicates an "or" relation between the associated objects.

It should be noted that, the expressions such as "up", "down", "left", "right" and the like provided by the embodiments of the present disclosure are descriptions with respect to views shown in the accompanying drawings and shall not be understood as limitations of the embodiments of the present disclosure. It should also be understood that, in the context herein, when it is mentioned that an element is formed "above" or "below" another element, it may indicate that an element is formed "above" or "below" another element directly, or it may also indicate that an element is formed "above" or "below" another element via an intermediate element.

It should be noted that, in a non-conflict case, features in the embodiments of the present disclosure may be combined with each other. The present disclosure will be further illustrated with reference to the accompanying drawings.

Figure 1:
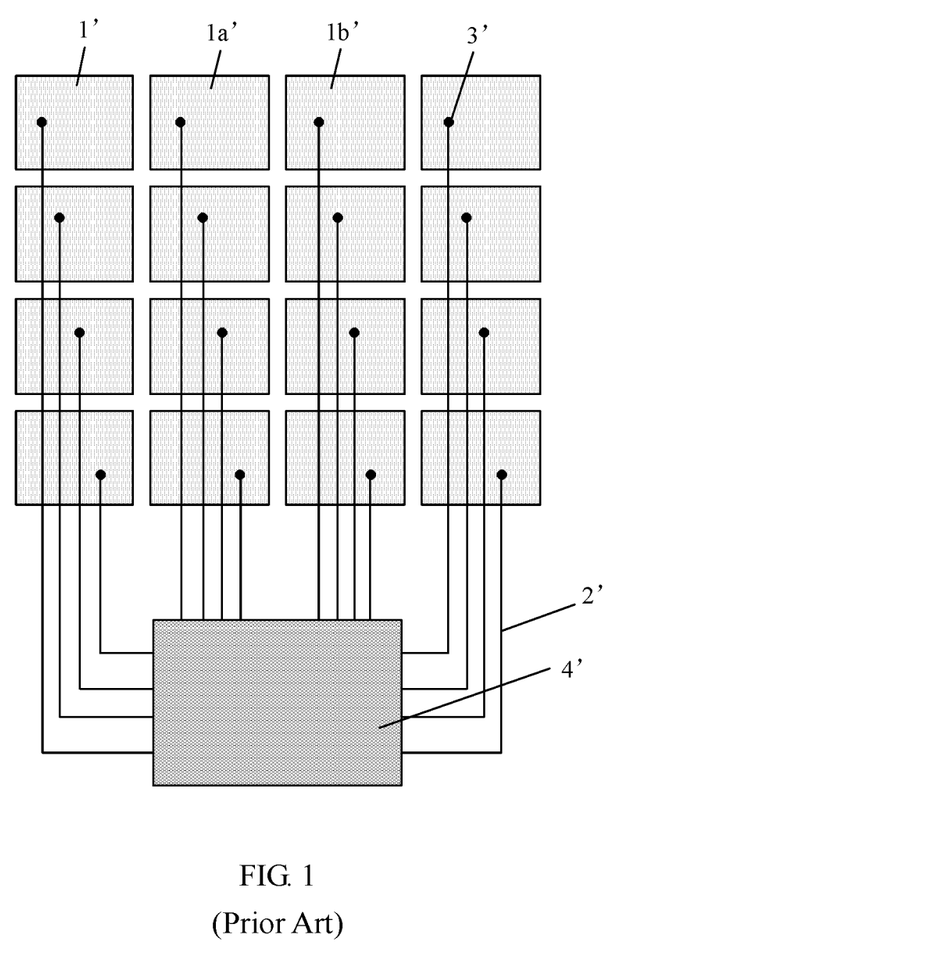
FIG. 1 illustrates a top view of an array substrate in the related art.
Figure 2:
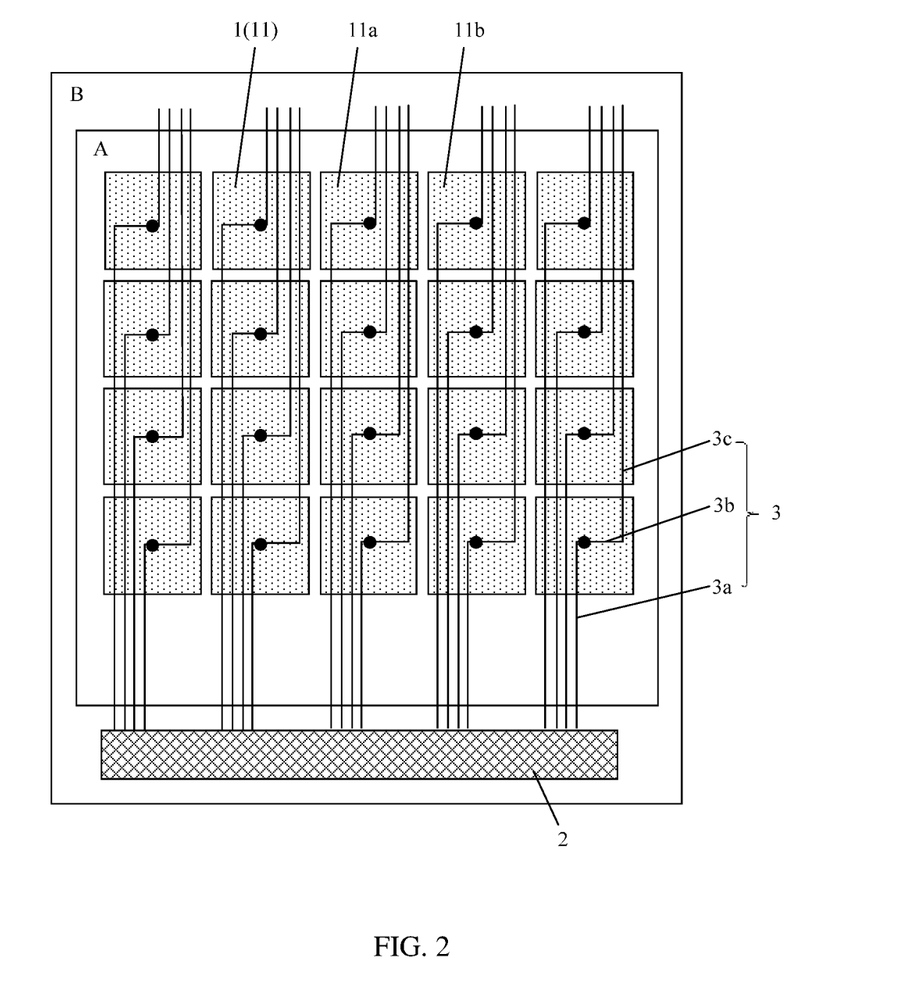
FIG. 2 illustrates a first top view of a display substrate according to an embodiment of the present disclosure.

An exemplary embodiment of the present disclosure provides a display substrate, as shown in FIG. 2, which is a first top view of a display substrate provided by an exemplary embodiment of the present disclosure, the display substrate includes a display area A and a peripheral area B surrounding the display area A; a common electrode layer 1 is provided in the display area A, and the common electrode layer 1 includes a plurality of common electrode blocks 11 arranged in an array, each common electrode block 11 is also used as a touch electrode during a touch stage; an integrated circuit 2 is provided in a portion of the peripheral area B corresponding to a column direction of the common electrode blocks 11, and the integrated circuit 2 is electrically connected with each common electrode block 11 through a plurality of lead wires 3.

n (n is the number of the lead wires) lead wires are provided corresponding to each column of common electrode blocks 11, each lead wire 3 includes a first portion 3a, a second portion 3b and a third portion 3c, an extending direction of the first portion 3a and the third portion 3c is the column direction of the common electrode blocks 11, and an extending direction of the second portion 3b is a row direction of the common electrode blocks 11, a first end of the first portion 3a is electrically connected with the integrated circuit 2, a second end of the first portion 3a is electrically connected with a first end of the second portion 3b, a second end of the second portion 3b is electrically connected with a first end of the third portion 3c; in each column of common electrode blocks 11 and its corresponding n lead wires 3, the second portion 3b of an $i^{th}$ lead wire 3 passes through a geometric center of an $i^{th}$ common electrode block 11 and is electrically connected with the $i^{th}$ common electrode block 11 at the geometric center, n is the number of the common electrode blocks 11 in each column, i is a positive integer greater than or equal to 1 and less than or equal to n. The first end of the first portion 3a may be electrically connected with the integrated circuit 2 directly or through a connecting line, which will not be limited by the embodiments of the present disclosure. Optionally, as shown in FIG. 2, each common electrode block 11 is shaped as a rectangle, obviously, each common electrode block 11 may also be shaped as another shape having a geometric center, such as a circle, a rhombus and the like, which will not be limited by the embodiments of the present disclosure.

Optionally, as shown in FIG. 2, in the n lead wires 3 corresponding to each column of common electrode block 11, the first portion 3a of each lead wire 3 is arranged successively in the row direction of the common electrode blocks 11, in each column of common electrode blocks 11, geometric centers of the common electrode blocks 11 are located in a straight line, and the lead wire 3 corresponding to the first portion 3a further away from the straight line in the row direction is electrically connected with the common electrode block 11 further away from the integrated circuit 2; the third portion 3c of each lead wire 3 is also arranged successively in the row direction of the common electrode blocks 11, in each column of common electrode blocks 11, the lead wire 3 corresponding to the third portion 3c further away from the straight line in the row direction is electrically connected with the common electrode block 11 closer to the integrated circuit 2.

Due to the above-described structure of the display substrate, a common electrode signal applied on each common electrode block 11 is uniformly distributed at each boundary of the common electrode block 11, the common electrode signal at adjacent boundaries of two adjacent common electrode blocks 11 can be similar or the same, a display difference is obviously reduced or even eliminated, thereby effectively improving display effect of the display device.

Figure 3:
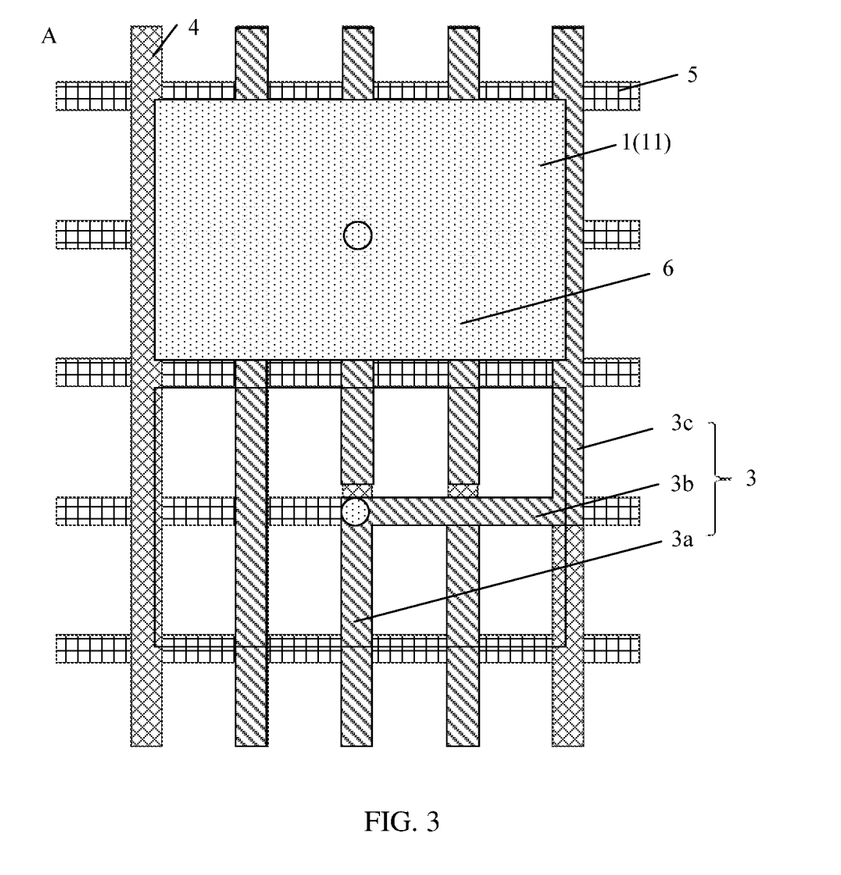
FIG. 3 illustrates a second top view of a display substrate according to an embodiment of the present disclosure.

Optionally, as shown in FIG. 3, which is a second top view of a display substrate provided by an exemplary embodiment of the present disclosure. A plurality of data lines 4 and a plurality of gate lines 5 are provided in the display area A of the display substrate, an extending direction of the plurality of data lines 4 is the column direction of the common electrode blocks 11, and an extending direction of the plurality of gate lines 5 is the row direction of the common electrode blocks 11. In a direction perpendicular to the display substrate, the first portion 3a and the third portion 3c of the lead wire 3 are arranged above the data lines 4, the second portion 3b of the lead wire 3 is arranged above the gate lines 5, since the data lines 4 and the gate lines 5 are light-proof, with the above arrangement of the lead wire 3, the lead wire 3 can be avoided from occupying light-transmitting area of the display substrate, and thus will not reduce aperture ratio of the display substrate. The plurality of data lines 4 and the plurality of gate lines 5 intersect with each other to define a plurality of sub-pixels, normally, one data line 4 corresponds to one column of sub-pixels, one gate line 5 corresponds to one row of sub-pixels, and each common electrode block 11 corresponds to a plurality of sub-pixels arranged in an array, the number of the sub-pixels corresponding to each common electrode block 11 is not limited by the embodiments of the present disclosure.

As can be seen from the above, each lead wire 3 corresponds to one common electrode block 11, and each common electrode block 11 corresponds to a plurality of sub-pixels arranged in an array. Therefore, in order to satisfy the requirements, it is only needed that the first portion 3a and/or the third portion 3c of the lead wire 3 is provided above a part of the plurality of data lines 4. Meanwhile the second portion 3b of the lead wire 3 is provided above a part of the plurality of gate lines 5. That is, the plurality of data lines 4 are divided into two groups, the first portion 3a and/or the third portion 3c of the lead wire 3 is provided above the first group of data lines 4, meanwhile no first portion 3a and/or no third portion 3c of the lead wire 3 is provided above the second group of data lines 4; the plurality of gate lines 5 are divided into two groups, the second portion 3b of the lead wire 3 is provided above the first group of gate lines 5, meanwhile no second portion 3b of the lead wire 3 is provided above the second group of gate lines 5.

Figure 4:
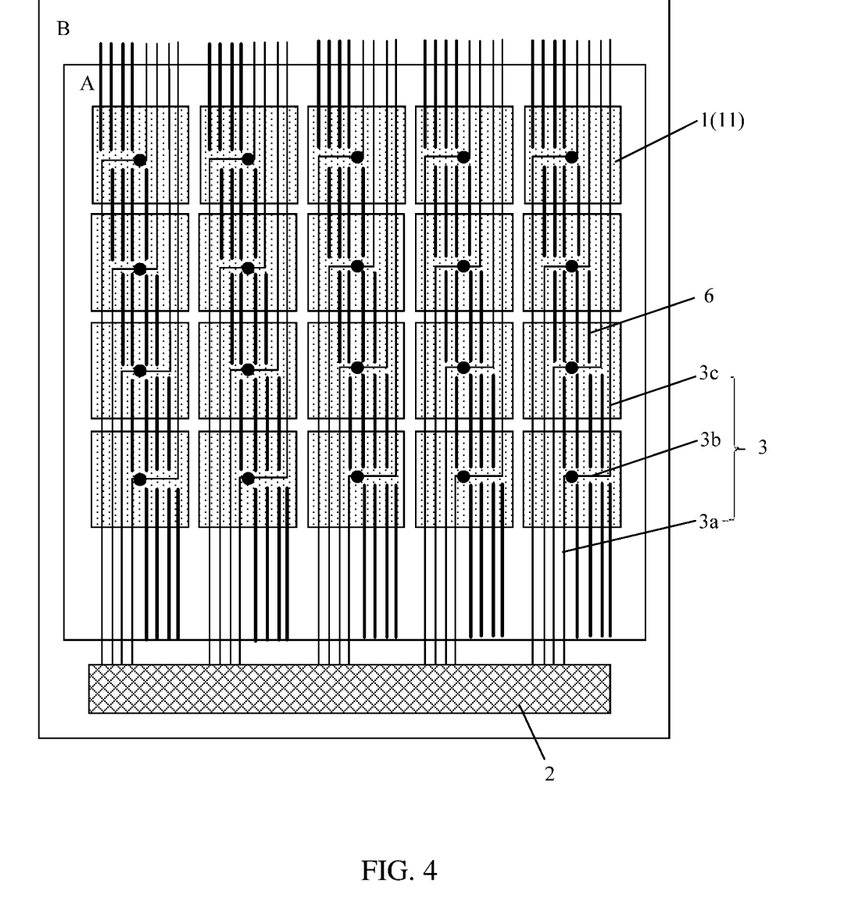
FIG. 4 illustrates a third top view of a display substrate according to an embodiment of the present disclosure.

Since a plurality of conduction layers are usually provided on the display substrate, and an electric coupling may be formed between different conduction layers, for instance, the electric coupling is formed between a section of the first group of data lines 4 covered by the first portion 3a and/or the third portion 3c of the lead wire 3 and the first portion 3a and/or the third portion 3c of the lead wire 3 provided above the first group of data lines 4; meanwhile the electric coupling does not exist between the other section of the first group of data lines 4 not covered by the first portion 3a and/or the third portion 3c of the lead wire 3 and the lead wire 3, the electric coupling also does not exist between the second group of data line 4 and the lead wire 3, so that electrical uniformity is poor at different portions of each data line 4, and electrical uniformity is also poor at different data lines 4, which will influence display effect of the display device. In order to solve the above problems, the embodiment of the present disclosure provides the following two optional manners:

Optionally, since the first portion 3a, the second portion 3b and the third portion 3c of the lead wire 3, the plurality of data lines 4, and the plurality of gate lines 5 have the above-described position relations, so that the part of the plurality of data lines 4, above which the first portions 3a and/or the third portion 3c of the lead wire 3 are provided, is partially covered by the first portions 3a and/or the third portion 3c of the lead wire 3. Based on this, as shown in FIG. 4, which is a third top view of a display substrate provided by an exemplary embodiment of the present disclosure. In the embodiment of the present disclosure, a compensation wiring 6 is provided above a section of the part of the plurality of data lines 4 not covered by the first portion 3a and/or the third portion 3c of the lead wire 3, in order to clearly illustrate the position relation between compensation wiring 6 and the lead wire 3, the plurality of data lines 4 and the plurality of gate lines 5 are not shown in FIG. 4. The part of the plurality of data lines 4 herein refers to the first group of data line 4 as described above. In this case, the electric coupling is formed between the section of the part of the plurality of data lines 4 not covered by the first portion 3a and/or the third portion 3c of the lead wire 3 and the compensation wiring 6, so that electrical uniformity at different portions of each data line 4 can be improved. No electrical signal is applied on any compensation wiring 6.

Figure 5:
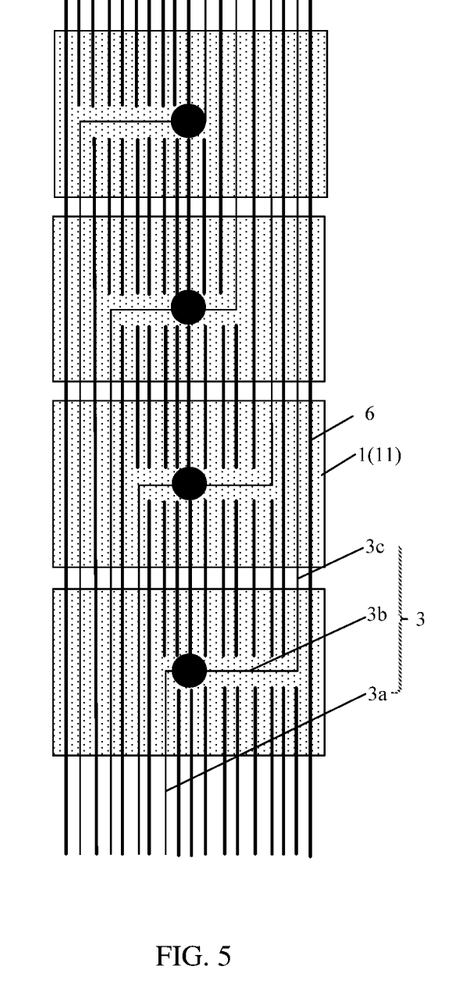
FIG. 5 illustrates a fourth top view of a display substrate according to an embodiment of the present disclosure.

Optionally, as shown in FIG. 5, which is a fourth top view of a display substrate provided by an exemplary embodiment of the present disclosure. The compensation wiring 6 is provided above every section of the plurality of data lines 4 not covered by the first portion 3a and/or the third portion 3c of the lead wire 3. The "every section of the plurality of data lines 4 not covered by the first portion 3a and/or the third portion 3c of the lead wire 3" refers to the second group of data lines 4 as described above and the section of the first group of data lines 4 not covered by the first portions 3a and/or the third portion 3c of the lead wire 3. As shown in FIG. 5, for example, one of each adjacent two data lines 4 belongs to the first group of data lines 4, i.e., this data line 4 is partially covered by the first portion 3a and/or the third portion 3c of the lead wire 3, and the other one of the adjacent two data lines 4 belongs to the second group of data lines 4, i.e., this data line 4 is not covered by the first portion 3a and/or the third portion 3c of the lead wire 3. In this case, the electric coupling is formed between the section of the part of the plurality of data lines 4 not covered by the first portion 3a and/or the third portion 3c of the lead wire 3 and the compensation wiring 6, so that electrical uniformity at different portions of each data line 4 can be improved, meanwhile the electric coupling is also formed between the other part of the plurality of data lines 4 not covered by the first portion 3a and/or the third portion 3c of the lead wire 3 and the compensation wiring 6, so that electrical uniformity at different data lines 4 can be improved. No electrical signal is applied on any compensation wiring 6.

In the above two optional manners provided by the embodiments of the present disclosure, the compensation wiring 6 and the lead wire 3 are arranged in a same layer and made of a same material, so that in an aspect the compensation wiring 6 and the lead wire 3 can be formed at the same time, which does not add manufacturing process of the display substrate, in another aspect, a film layer between the compensation wiring 6 and the data line 4 is exactly the film layer between the data line 4 and the first portion 3a and/or the third portion 3c of the lead wire 3, an electric coupling effect between the compensation wiring 6 and the data line 4 is the same as an electric coupling effect between the data line 4 and the first portion 3a and/or the third portion 3c of the lead wire 3, so that electrical uniformity of the display substrate can be further improved.

In addition, the applicant of the present disclosure has found that, in the row direction of the common electrode blocks 11, an electric coupling effect between a position where two adjacent common electrode blocks 11 are close to each other and other conduction layers varies, which also causes that the common electrode signal at the position where two adjacent common electrode blocks 11 are close to each other varies, so that a display difference exists, thereby influencing display effect of the display device. For instance, as shown in FIG. 2, no plurality of lead wires 3 is provided below a left portion of a common electrode block 11a, meanwhile a plurality of lead wires 3 is provided below a right portion of the common electrode block 11a, no plurality of lead wires 3 is provided below a left portion of a common electrode block 11b, meanwhile a plurality of lead wires 3 is provided below a right portion of the common electrode block 11b, so that the electric coupling is formed between the right portion of the common electrode block 11a and the lead wire 3, meanwhile no electric coupling is formed between the left portion of the common electrode block 11b and the lead wire 3, which causes that the common electrode signal at the right portion of the common electrode block 11a is different from the common electrode signal of the left portion of the common electrode block 11b, so that a display difference exists, thereby influencing display effect of the display device.

Figure 6:
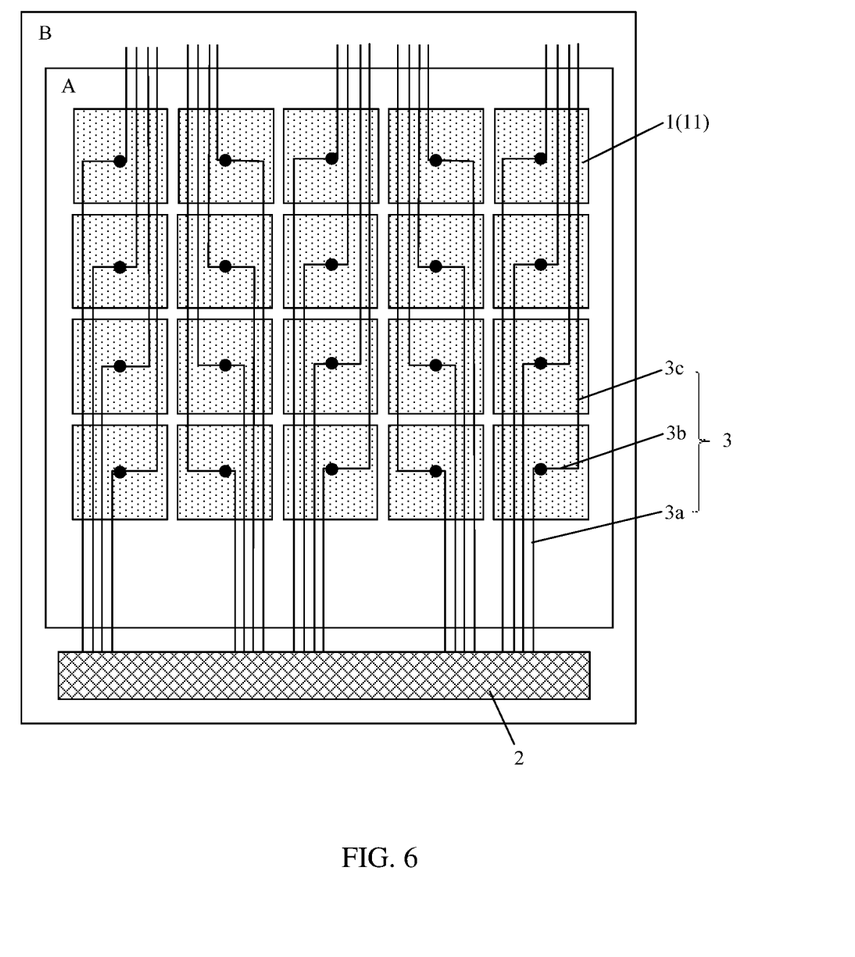
FIG. 6 illustrates a fifth top view of a display substrate according to an embodiment of the present disclosure.

Based on this, as shown in FIG. 6, which is a fifth top view of a display substrate provided by an exemplary embodiment of the present disclosure. In the embodiment of the present disclosure, a plurality of lead wires 3 corresponding to each column of common electrode blocks 11 is arranged symmetrically to a plurality of lead wires 3 corresponding to the adjacent column of common electrode blocks 11 along the column direction of the common electrode blocks 11. In this case, in the row direction of the common electrode blocks 11, the electrode signal at the position where two adjacent common electrode blocks 11 are close to each other is similar or the same, a display difference is reduced or even eliminated, thereby effectively improving display effect of the display device.

Optionally, as shown in FIGS. 2 and 4-6, a second end of the third portion 3c of each lead wire 3 extends into a portion in the peripheral area B opposite to the integrated circuit 2, so that each common electrode block 11 can have a same overlap area with the lead wire 3, and thus the electric coupling effect between each common electrode block 11 and the lead wire 3 is the same as the electric coupling effect between another common electrode block 11 and the lead wire 3, which can help improve electrical uniformity of the display substrate.

Figure 7:
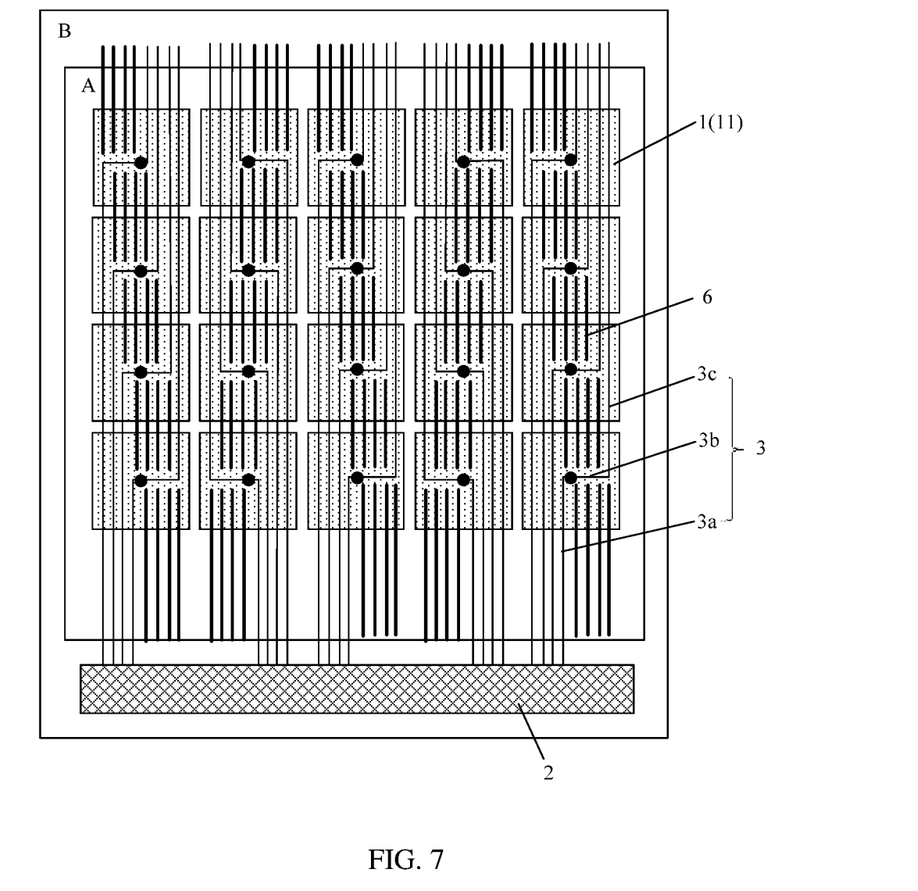
FIG. 7 illustrates a sixth top view of a display substrate according to an embodiment of the present disclosure.

It should be noted that, those skilled in the art may select one or a combination of the above-described manners in which electrical uniformity of the display substrate can be improved, which will not be limited by the embodiments of the present disclosure. For instance, as shown in FIG. 7, which is a sixth top view of a display substrate provided by an exemplary embodiment of the present disclosure, the compensation wiring 6 is provided above the section of the plurality of data lines 4 not covered by the first portion 3a and/or the third portion 3c of the lead wire 3, a plurality of lead wires 3 corresponding to each column of common electrode blocks 11 is arranged symmetrically to a plurality of lead wires 3 corresponding to the adjacent column of common electrode blocks 11 along the column direction of the common electrode blocks 11, and the second end of the third portion 3c of each lead wire 3 extends into the portion in the peripheral area B opposite to the integrated circuit 2.

In addition, in the embodiments of the present disclosure, all common electrode blocks 11 are connected in a short circuit during the display stage, so as to improve uniformity of the common electrode signal on different common electrode blocks 11. There may be a plurality of manners in which the common electrode blocks 11 are connected in a short circuit during the display stage, and examples of the embodiments of the present disclosure will be described.

Figure 8:
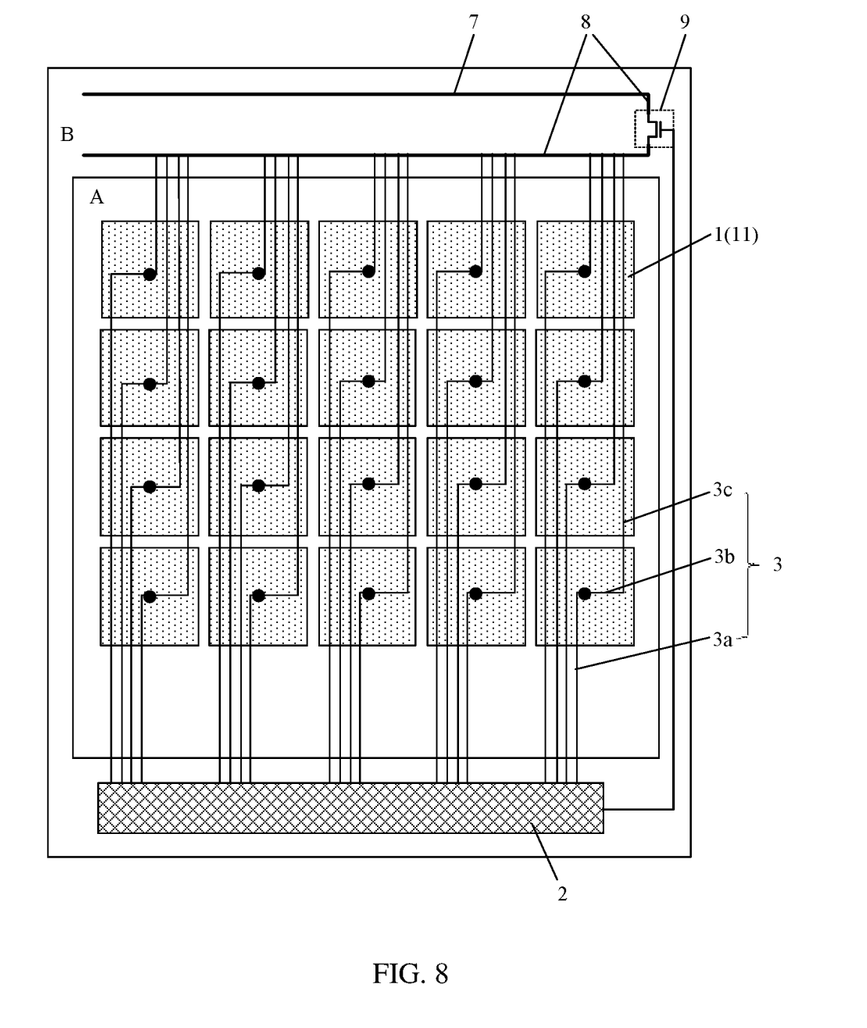
FIG. 8 illustrates a seventh top view of a display substrate according to an embodiment of the present disclosure.
Figure 9:
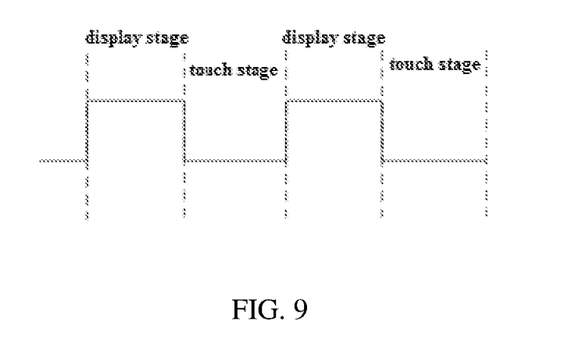
FIG. 9 is a waveform diagram of a control signal of an integrated circuit according to an embodiment of the present disclosure.

In a first example, as shown in FIG. 8, which is a seventh top view of a display substrate provided by an exemplary embodiment of the present disclosure. A common electrode line 7, a connecting line 8 and a switch 9 are provided in a portion in the peripheral area B of the display substrate opposite to the integrated circuit 2, one end of the connecting line 8 is electrically connected with the common electrode line 7, the second end of the third portion 3c of each lead wire 3 is electrically connected with the connecting line 8, two ends of the switch 9 are connected in series with the connecting line 8, so that during the display stage, the switch 9 can be turned off and all common electrode blocks 11 are connected in a short circuit, thereby improving uniformity of the common electrode signal on different common electrode blocks 11. The integrated circuit 2 can control the switch 9 to turn on or turn off. For example, the switch 9 is a thin film transistor, a source electrode and a drain electrode of the thin film transistor are respectively electrically connected with the connecting line 8, a gate electrode of the thin film transistor is electrically connected with the integrated circuit 2, a control signal output from the integrated circuit 2 controls whether the source electrode of the switch 9 is conducted with the drain electrode of the switch 9, when the thin film transistor is an N-type thin film transistor, as shown in FIG. 9, which is a waveform diagram of a control signal of an integrated circuit provided by an exemplary embodiment of the present disclosure, during the display stage, the integrated circuit 2 outputs a high-level control signal, and the thin film transistor is conducted; during the touch stage, the integrated circuit 2 outputs a low-level control signal, and the thin film transistor is cut-off. When the switch 9 is the thin film transistor, the switch 9 can be formed with a thin film transistor in the display area A at the same time, which does not add manufacturing process of the display substrate.

Figure 10:
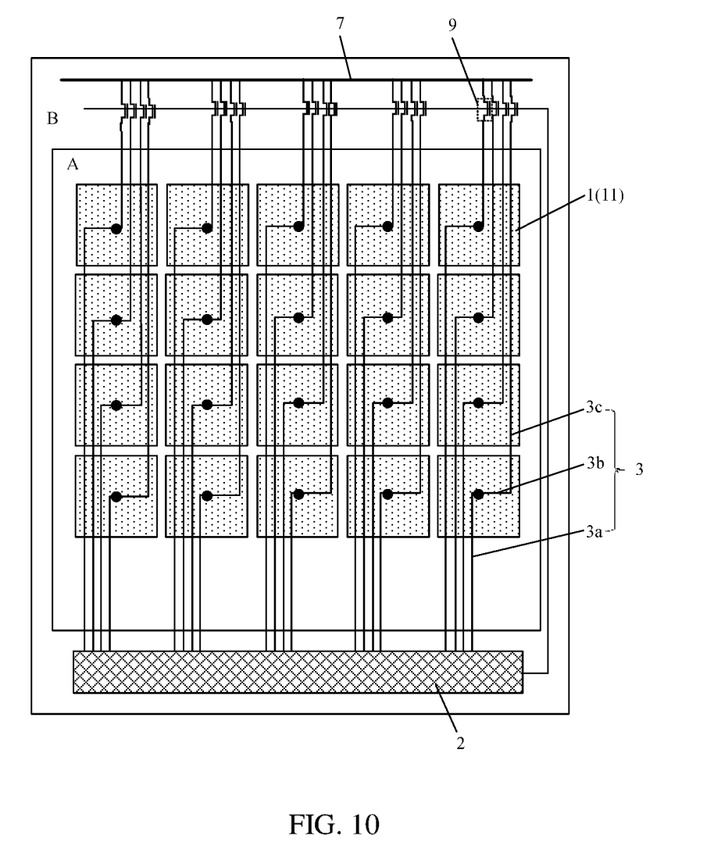
FIG. 10 illustrates an eighth top view of a display substrate according to an embodiment of the present disclosure.

In a second example, as shown in FIG. 10, which is an eighth top view of a display substrate provided by an exemplary embodiment of the present disclosure. A common electrode line 7 and a plurality of switches 9 are provided in the portion in the peripheral area B of the display substrate opposite to the integrated circuit 2, the plurality of switches 9 correspond to the lead wires 3 one by one, one end of each switch is electrically connected with the common electrode line 7, and the other end of each switch is electrically connected with the second end of the third portion 3c of the lead wire 3 corresponding to the switch, so that during the display stage, all switches 9 can be turned off and all common electrode blocks 11 are connected in a short circuit, thereby improving uniformity of the common electrode signal on different common electrode blocks 11. The integrated circuit 2 can control the plurality of switches 9 to turn on or turn off. For example, each switch 9 is a thin film transistor, a source electrode of the thin film transistor is electrically connected with the common electrode line 7, a drain electrode of the thin film transistor is connected with the second end of the third portion 3c of the lead wire 3, and a gate electrode of the thin film transistor is electrically connected with the integrated circuit 2, a control signal output from the integrated circuit 2 controls whether the source electrode of each switch 9 is conducted with the drain electrode of the same switch 9, when the thin film transistor is an N-type thin film transistor, as shown in FIG. 9, during the display stage, the integrated circuit 2 outputs a high-level control signal, and the thin film transistor is conducted; during the touch stage, the integrated circuit 2 outputs a low-level control signal, and the thin film transistor is cut-off. When each switch 9 is the thin film transistor, the switch 9 can be formed with a thin film transistor in the display area A at the same time, which does not add manufacturing process of the display substrate.

Other film layers included in the display substrate and position/connection relations among the film layers will be described in the following embodiments of the present disclosure.

Figure 11:
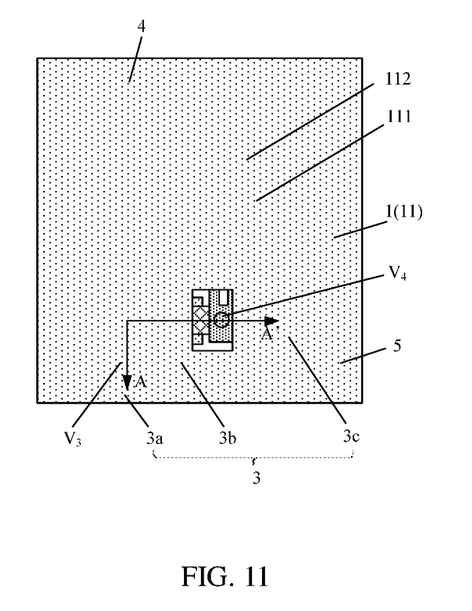
FIG. 11 illustrates a ninth top view of a display substrate according to an embodiment of the present disclosure.
Figure 12:
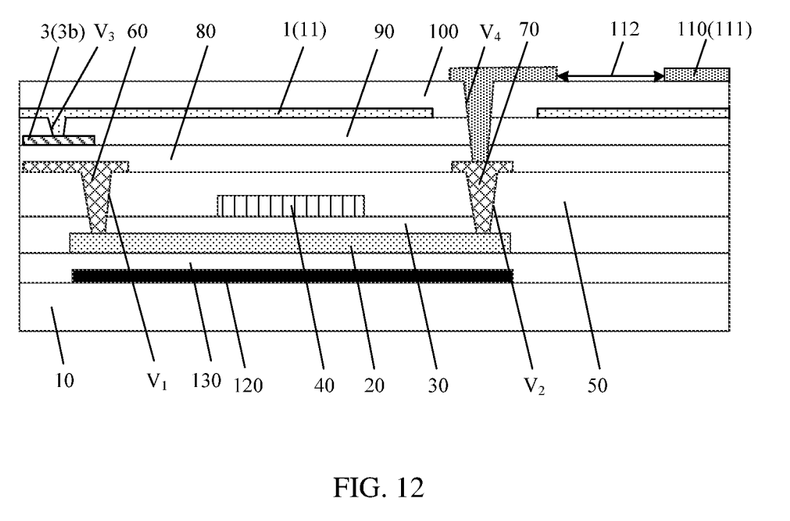
FIG. 12 is a cross-sectional view along A-A' direction of FIG. 11 according to an embodiment of the present disclosure.

Optionally, as shown in FIGS. 11-12, wherein FIG. 11 is a ninth top view of a display substrate provided by an exemplary embodiment of the present disclosure, and FIG. 12 is a schematic cross-sectional view along A-A' direction of FIG. 11 provided by the embodiment of the present disclosure. The display substrate further includes a base substrate 10, and successively on the base substrate 10, an active layer 20, a first insulation layer 30, a gate electrode 40, a second insulation layer 50, a source electrode 60, a drain electrode 70 and a third insulation layer 80. The source electrode 60 and the drain electrode 70 are arranged in a same layer. The source electrode 60 is connected with the active layer 20 by a first through-hole $V_1$ penetrating through the first insulation layer 30 and the second insulation layer 50, the drain electrode 70 is connected with the active layer 20 by a second through-hole $V_2$ penetrating through the first insulation layer 30 and the second insulation layer 50, the source electrode 60 and the data line 4 are arranged in a same layer and electrically connected with each other, the gate electrode 40 and the gate line 5 are arranged in a same layer and electrically connected with each other; a plurality of lead wires 3 are arranged at a side of the third insulation layer 80 away from the base substrate 10, and a fourth insulation layer 90 is arranged in a portion of the plurality of lead wires 3 away from the base substrate 10, a plurality of common electrode blocks 11 are arranged at a side of the fourth insulation layer 90 away from the base substrate 10, each common electrode block 11 is electrically connected with the second portion 3b of the corresponding lead wire 3 by a third through-hole $V_3$ penetrating through the fourth insulation layer 90.

Further, as shown in FIG. 12, the display substrate further includes a fifth insulation layer 100 and a pixel electrode layer 110, the fifth insulation layer 100 is arranged at a side of the plurality of common electrode blocks 11 away from the base substrate 10, and the pixel electrode layer 110 is arranged at a side of the fifth insulation layer 100 away from the base substrate 10, the pixel electrode layer 110 includes a plurality of pixel electrodes 111 arranged in an array, each pixel electrode 111 is provided with a slit 112, each pixel electrode 111 is electrically connected with a corresponding drain electrode 70 by a fourth through-hole $V_4$ penetrating through the third insulation layer 80, the fourth insulation layer 90 and the fifth insulation layer 100. During the display stage, an electric field is formed between the electrode and the common electrode, under the action of the electric field, liquid crystal molecules deflect, and thus the display panel displays a frame.

Optionally, as shown in FIG. 12, a shading layer 120 is provided between the base substrate 10 and the active layer 20, and a sixth insulation layer 130 is provided between the shading layer 120 and the active layer 20, the shading layer 120 can effectively block light emitted from a backlight module, so as to avoid the light to be emitted onto a channel area of the active layer 20, and thus avoiding that a photo-electric effect happens at the channel area and influences electrical property thereof.

Figure 13:
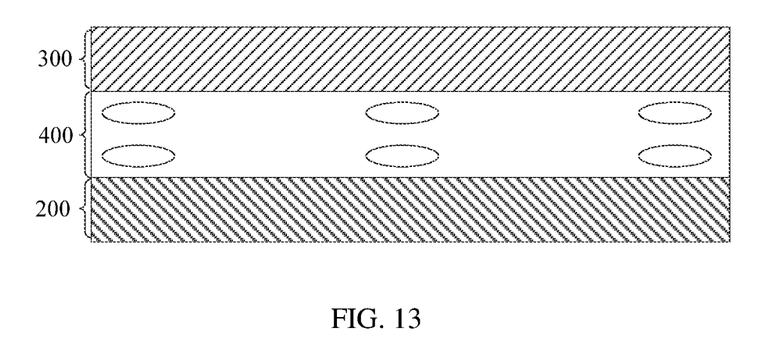
FIG. 13 is a cross-sectional view of a liquid crystal display panel according to an embodiment of the present disclosure.

In addition, the embodiments of the present disclosure provide a display panel, including the display substrate as described in any of the above embodiments. Optionally, the display panel is a liquid crystal display panel, as shown in FIG. 13, which is a schematic cross-sectional view of a liquid crystal display panel provided by an exemplary embodiment of the present disclosure. The liquid crystal display panel includes the display substrate 200 as described in any of the above, a color film substrate 300, and a liquid crystal layer 400 arranged between the display substrate 200 and the color film substrate 300.

Figure 14:
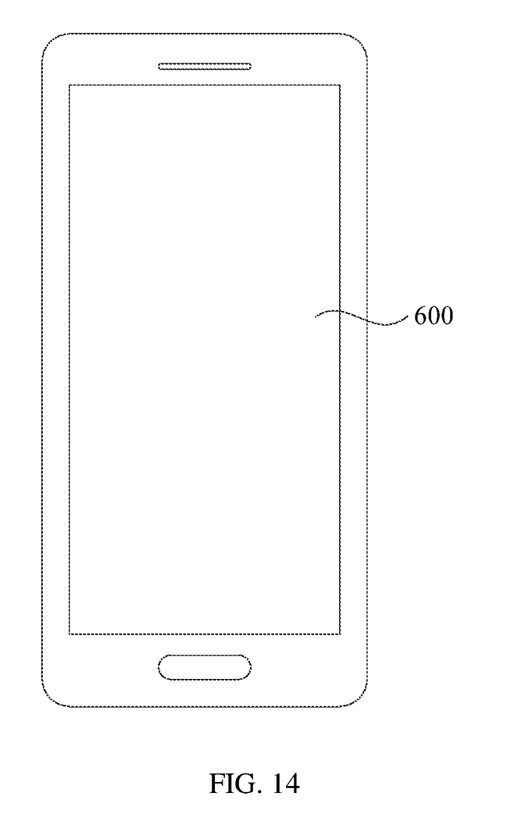
FIG. 14 is a top view of a display device according to an embodiment of the present disclosure.

An embodiment of the present disclosure further provides a display device, as shown in FIG. 14, which is a top view of a display device provided by an exemplary embodiment of the present disclosure. The display device includes the display panel 600 as described in any of the above embodiments. The display device provided by the embodiments of the present disclosure may be any product or component having a display function, such as a smartphone, a wearable smartwatch, a smartglasses, a tablet computer, a television set, a displayer, a laptop computer, a digital photo frame, a navigator, a car displayer, an electronic book and the like.

The embodiments of the present disclosure provide a display substrate, a display panel and a display device, each common electrode block 11 provided in the display area A of the display substrate is also used as the touch electrode during the touch stage, n lead wires 3 are provided corresponding to each column of common electrode blocks 11, each lead wire 3 includes the first portion 3a, the second portion 3b and the third portion 3c, the extending direction of the first portion 3a and the third portion 3c is the column direction of the common electrode blocks 11, and the extending direction of the second portion 3b is the row direction of the common electrode blocks 11, the first end of the first portion 3a is electrically connected with the integrated circuit 2, the second end of the first portion 3a is electrically connected with the first end of the second portion 3b, the second end of the second portion 3b is electrically connected with the first end of the third portion 3c, since the second portion 3b of the $i^{th}$ lead wire 3 passes through the geometric center of the $i^{th}$ common electrode block 11 and is electrically connected with the $i^{th}$ common electrode block 11 at the geometric center, n is the total number of the common electrode block 11 in each column, i is the positive integer greater than or equal to 1 and less than or equal to n, so that the common electrode signal applied on each common electrode block 11 is uniformly distributed at each boundary of the common electrode block 11, the common electrode signal at adjacent boundaries of two adjacent common electrode blocks 11 can be similar or the same, the display difference is obviously reduced or even eliminated, thereby effectively improving display effect of the display device.

The above are merely preferred embodiments of the present disclosure, which are not used to limit the present disclosure. All the modifications, equivalent substitutions and improvements made within the spirit and principles of the present disclosure shall fall into the protection scope of the present disclosure.

What is claimed is:
1. A display substrate, comprising:
a display area; and a peripheral area surrounding the display area;

wherein a common electrode layer is placed in the display area, the common electrode layer comprises a plurality of common electrode blocks arranged in an array, each common electrode block is also used as a touch electrode during a touch stage;

wherein an integrated circuit is arranged in a portion of the peripheral area corresponding to a column direction of the common electrode blocks, the integrated circuit is electrically connected with the plurality of common electrode blocks by a plurality of lead wires;

wherein n lead wires are provided corresponding to each column of the common electrode blocks, and a total number of the common electrode blocks in each column is n; each lead wire comprises a first portion, a second portion and a third portion, an extending direction of the first portion and the third portion is the column direction of the common electrode blocks, an extending direction of the second portion is a row direction of the common electrode blocks, a first end of the first portion is electrically connected with the integrated circuit, a second end of the first portion is electrically connected with a first end of the second portion, and a second end of the second portion is electrically connected with a first end of the third portion; and for each column of the common electrode blocks, the second portion of an $i^{th}$ lead wire passes a geometric center of an $i^{th}$ common electrode block and is electrically connected with the $i^{th}$ common electrode block at the geometric center of the $i^{th}$ common electrode block, i is a positive integer, and $1 \leq i \leq n$; and wherein a plurality of data lines is placed in the display area, and a plurality of gate lines is placed in the display area, wherein an extending direction of the plurality of data lines is the column direction of the common electrode blocks, an extending direction of the plurality of gate lines is the row direction of the common electrode blocks, and in a direction perpendicular to the display substrate, the first portions and the third portions of the plurality of lead wires are placed above the plurality of data lines, and the second portions of the plurality of lead wires are arranged above the plurality of gate lines.

2. The display substrate according to claim 1, wherein the plurality of data lines above which the first portions and/or the third portions of the plurality of lead wires are placed is partially covered by the first portions and/or the third portions of the plurality of lead wires, and a compensation wiring is placed above the plurality of data lines which is not covered by the first portions and/or the third portions of the plurality of lead wires.

3. The display substrate according to claim 2, wherein the compensation wiring and the lead wire are arranged in a same layer and are made of a same material.

4. The display substrate according to claim 1, wherein a compensation wiring is placed above the plurality of data lines which are not covered by the first portions and/or the third portions of the plurality of lead wires.

5. The display substrate according to claim 4, wherein the compensation wiring and the lead wire are arranged in a same layer and are made of a same material.

6. The display substrate according claim 1, wherein the n lead wires corresponding to each column of the common electrode blocks are arranged symmetrically with respect to the n lead wires corresponding to an adjacent column of the common electrode blocks along the column direction of the common electrode blocks.

7. The display substrate according to claim 1, wherein a second end of the third portion of each of the plurality of lead wires extends into a portion of the peripheral area opposite to the integrated circuit.

8. The display substrate according to claim 7, wherein a common electrode line, a connecting line and a switch are further placed in the portion of the peripheral area opposite to the integrated circuit, one end of the connecting line is electrically connected with the common electrode line, the second end of the third portion of each of the plurality of lead wires is electrically connected with the connecting line, and two ends of the switch are connected in series with the connecting line.

9. The display substrate according to claim 8, wherein the switch is a thin film transistor, a source electrode and a drain electrode of the thin film transistor are respectively electrically connected with the connecting line, and a gate electrode of the thin film transistor is electrically connected with the integrated circuit.

10. The display substrate according to claim 7, wherein a common electrode line and a plurality of switches are further provided in the portion of the peripheral area opposite to the integrated circuit, the plurality of switches one-to-one correspond to the plurality of lead wires, one end of each switch is electrically connected with the common electrode line, and the other end of each switch is electrically connected with the second end of the third portion of a corresponding lead wire.

11. The display substrate according to claim 10, wherein each of the plurality of switches is a thin film transistor, a source electrode of the thin film transistor is electrically connected with the common electrode line, a drain electrode of the thin film transistor is electrically connected with the second end of the third portion of a corresponding lead wire, and a gate electrode of the thin film transistor is electrically connected with the integrated circuit.

12. The display substrate according to claim 1, wherein in the n lead wires corresponding to each column of the common electrode blocks, the first portions of the n lead wires are arranged successively in the row direction of the common electrode blocks, and the third portions of the n lead wires are also arranged successively in the row direction of the common electrode blocks; geometric centers of the n common electrode blocks in each column are located in a straight line, and the n common electrode blocks in each column are electrically connected with the n lead wires corresponding to the column in one to one correspondence; for any two common electrode blocks of the n common electrode blocks in each column and two lead wires that are electrically connected to the two common electrode blocks, one lead wire of the two lead wires having its first portion farther away from the straight line than the first portion of the other lead wire of the two lead wires in the row direction of the electrode blocks is electrically connected to one common electrode block of the two common electrode blocks which is farther away from the integrated circuit than the other common electrode block of the two common electrode blocks, and one lead wire of the two lead wires having its third portion farther away from the straight line than the third portion of the other lead wire of the two lead wires in the row direction of the electrode blocks is electrically connected to one common electrode block of the two common electrode blocks which is closer to the integrated circuit than the other common electrode block of the two common electrode blocks.

13. The display substrate according to claim 1, further comprising a base substrate, wherein an active layer, a first insulation layer, a gate electrode, a second insulation layer, a source electrode, a drain electrode and a third insulation layer are successively arranged on the base substrate; the source electrode and the drain electrode are arranged at a same layer; the source electrode is connected with the active layer through a first through-hole penetrating through the first insulation layer and the second insulation layer, and the drain electrode is connected with the active layer through a second through-hole penetrating through the first insulation layer and the second insulation layer; and wherein the plurality of lead wires are arranged at a side of the third insulation layer away from the base substrate, the fourth insulation layer is arranged at a side of the plurality of lead wires away from the base substrate, the plurality of common electrode blocks are arranged at a side of the fourth insulation layer away from the base substrate, each of the plurality of common electrode blocks is electrically connected with the second portion of a corresponding lead wire through a third through-hole penetrating through the fourth insulation layer.

14. The display substrate according to claim 13, further comprising:
a fifth insulation layer; and
a pixel electrode layer, the pixel electrode layer comprising a plurality of pixel electrodes arranged in an array;
wherein the fifth insulation layer is arranged at a side of the plurality of common electrode blocks away from the base substrate, the pixel electrode layer is arranged at a side of the fifth insulation layer away from the base substrate, a slit is defined in each pixel electrode, and each pixel electrode is electrically connected with a corresponding drain electrode through a fourth through-hole penetrating through the third insulation layer, the fourth insulation layer and the fifth insulation layer.

15. The display substrate according to claim 1, wherein each of the plurality of common electrode blocks is shaped as a rectangle.

16. A display panel, comprising a display substrate, wherein the display substrate comprises:
a display area; and
a peripheral area surrounding the display area;
wherein a common electrode layer is placed in the display area, the common electrode layer comprises a plurality of common electrode blocks arranged in an array, each common electrode block is also used as a touch electrode during a touch stage;
wherein an integrated circuit is arranged in a portion of the peripheral area corresponding to a column direction of the common electrode blocks, the integrated circuit is electrically connected with the plurality of common electrode blocks by a plurality of lead wires;
wherein n lead wires are provided corresponding to each column of the common electrode blocks, and a total number of the common electrode blocks in each column is n; each lead wire comprises a first portion, a second portion and a third portion, an extending direction of the first portion and the third portion is the column direction of the common electrode blocks, an extending direction of the second portion is a row direction of the common electrode blocks, a first end of the first portion is electrically connected with the integrated circuit, a second end of the first portion is electrically connected with a first end of the second portion, and a second end of the second portion is electrically connected with a first end of the third portion; and for each column of the common electrode blocks, the second portion of an $i^{th}$ lead wire passes a geometric center of an $i^{th}$ common electrode block and is electrically connected with the $i^{th}$ common electrode block at the geometric center of the $i^{th}$ common electrode block, i is a positive integer, and $1 \leq i \leq n$; and wherein a plurality of data lines is placed in the display area, and a plurality of gate lines is placed in the display area, wherein an extending direction of the plurality of data lines is the column direction of the common electrode blocks, an extending direction of the plurality of gate lines is the row direction of the common electrode blocks, and in a direction perpendicular to the display substrate, the first portions and the third portions of the plurality of lead wires are placed above the plurality of data lines, and the second portions of the plurality of lead wires are arranged above the plurality of gate lines.

17. A display device, comprising a display panel, wherein the display panel comprises a display substrate, wherein the display substrate comprises:
a display area; and
a peripheral area surrounding the display area;
wherein a common electrode layer is placed in the display area, the common electrode layer comprises a plurality of common electrode blocks arranged in an array, each common electrode block is also used as a touch electrode during a touch stage;
wherein an integrated circuit is arranged in a portion of the peripheral area corresponding to a column direction of the common electrode blocks, the integrated circuit is electrically connected with the plurality of common electrode blocks by a plurality of lead wires;
wherein n lead wires are provided corresponding to each column of the common electrode blocks, and a total number of the common electrode blocks in each column is n; each lead wire comprises a first portion, a second portion and a third portion, an extending direction of the first portion and the third portion is the column direction of the common electrode blocks, an extending direction of the second portion is a row direction of the common electrode blocks, a first end of the first portion is electrically connected with the integrated circuit, a second end of the first portion is electrically connected with a first end of the second portion, and a second end of the second portion is electrically connected with a first end of the third portion; and for each column of the common electrode blocks, the second portion of an $i^{th}$ lead wire passes a geometric center of an $i^{th}$ common electrode block and is electrically connected with the $i^{th}$ common electrode block at the geometric center of the $i^{th}$ common electrode block, i is a positive integer, and $1 \leq i \leq n$; and wherein a plurality of data lines is placed in the display area, and a plurality of gate lines is placed in the display area, wherein an extending direction of the plurality of data lines is the column direction of the common electrode blocks, an extending direction of the plurality of gate lines is the row direction of the common electrode blocks, and in a direction perpendicular to the display substrate, the first portions and the third portions of the plurality of lead wires are placed above the plurality of data lines, and the second portions of the plurality of lead wires are arranged above the plurality of gate lines.

* * * * *